United States Patent
Park et al.

(10) Patent No.: US 7,394,099 B2
(45) Date of Patent: Jul. 1, 2008

(54) THIN FILM ARRAY PANEL

(75) Inventors: Myung-Jae Park, Suwon (KR);
Hyang-Shik Kong, Suwon (KR);
Young-Joon Rhee, Seoul (KR);
Hyeong-Jun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 23 days.

(21) Appl. No.: 10/931,338

(22) Filed: Aug. 31, 2004

(65) Prior Publication Data

US 2005/0098781 A1    May 12, 2005

(30) Foreign Application Priority Data

Sep. 4, 2003    (KR)    .................... 10-2003-0061743

(51) Int. Cl.
*H01L 27/14* (2006.01)
(52) U.S. Cl. ........................................ 257/72
(58) Field of Classification Search ............. 257/59, 257/72, 434, 359, E29.151; 438/48
See application file for complete search history.

(56) References Cited

U.S. PATENT DOCUMENTS

| | | | |
|---|---|---|---|
| 6,300,987 B1 | 10/2001 | Jung | |
| 6,559,904 B1 | 5/2003 | Kwak et al. | |
| 6,835,586 B2 * | 12/2004 | Yamazaki et al. | 438/48 |
| 6,887,742 B2 * | 5/2005 | Baek et al. | 438/149 |
| 2001/0032981 A1 * | 10/2001 | Kong et al. | 257/72 |
| 2002/0047120 A1 * | 4/2002 | Inukai | 257/59 |
| 2003/0094615 A1 * | 5/2003 | Yamazaki et al. | 257/72 |
| 2005/0236624 A1 * | 10/2005 | Kim et al. | 257/66 |

* cited by examiner

*Primary Examiner*—Nathan W Ha
(74) *Attorney, Agent, or Firm*—MacPherson Kwok Chen & Heid LLP

(57) ABSTRACT

A thin film transistor array panel is provided, which includes: a gate line; first and second data lines insulated from the gate line; a thin film transistor connected to the gate line and the first data line; a pixel electrode disposed between the first data line and the second data line, spaced apart from the first and the second data lines, and coupled to the thin film transistor; and first and second projections connected to the pixel electrode and overlapping the first and the second data lines, respectively.

17 Claims, 5 Drawing Sheets

THIN FILM ARRAY PANEL

CROSS-REFERENCE TO RELATED APPLICATION

This application claims priority, under 35 U.S.C. Section 119, from Korean Patent Application Serial No. 10-2003-0061743 filed on Sep. 4, 2003, which is incorporated herein by reference in its entirety.

BACKGROUND OF THE INVENTION (a) Field of the Invention

The present invention relates to a thin film array panel.

(b) Description of the Related Art

Generally, a thin film array panel is used for display devices such as liquid crystal displays (LCDs) and organic light emitting displays (OLED).

The LCD is one of the most widely used flat panel displays. The general structure of an LCD consists of a liquid crystal (LC) layer that is positioned between a pair of panels including field generating electrodes and polarizers. The LC layer is subjected to an electric field generated by the electrodes and variations in the field strength change the molecular orientation of the LC layer. For example, upon application of an electric field, the molecules of the LC layer change their orientation to change the polarization of light passing through the LC layer. Appropriately positioned polarizing filters selectively block the polarized light, creating bright and dark areas that can represent desired images.

The thin film array panel for display device generally includes a plurality of pixel electrodes, a plurality of thin film transistors (TFTs) for controlling signals to be applied to the pixel electrodes, and a plurality of signal lines transmitting the signals. The signal lines include gate lines for controlling the TFTs and data lines transmitting data signals to the pixel electrodes.

However, the signal lines may make parasitic capacitances that deteriorate image quality. In particular, the parasitic capacitance between the data lines and the pixel electrodes is significant and this may be varied depending on the positions due to alignment margin in a divisional exposure of a manufacturing process. The difference of the parasitic capacitances may make the image quality worse.

SUMMARY OF THE INVENTION

A motivation of the present invention is to solve the problems of the conventional art.

A thin film transistor array panel is provided, which includes: a gate line; first and second data lines insulated from the gate line; a thin film transistor connected to the gate line and the first data line; a pixel electrode disposed between the first data line and the second data line, spaced apart from the first and the second data lines, and coupled to the thin film transistor; and first and second projections connected to the pixel electrode and overlapping the first and the second data lines, respectively.

The thin film transistor array panel may further include an insulating layer disposed between the first and the second data lines; and the pixel electrodes and the first and the second projections.

The insulating layer may include inorganic material.

Preferably, the first and the second projections fully overlap the first and the data lines. Alternatively, the first and the second projections may have a width smaller than width of the first and the second data lines. The first and the second projections may be elongated in a direction where the first and the second data lines extend.

The thin film transistor array panel may further include first and second connections connecting the first and the second projections to the pixel electrode, respectively.

A thin film transistor array panel is provided, which includes: a substrate; a gate line; a gate insulating layer disposed between the gate line; a semiconductor layer disposed on the gate insulating layer; an ohmic contact layer disposed on the semiconductor layer; first and second data lines disposed at least on the ohmic contact layer; a passivation layer disposed on the first and the second data lines; and a pixel electrode that is disposed on the passivation layer and includes first and second projections overlapping the first and the second data lines, respectively.

The pixel electrode may be located between the first data line and the second data line and spaced apart from the first and the second data lines.

The passivation layer may include inorganic material.

The first and the second projections may fully overlap the first and the data lines, respectively, or have a width smaller than width of the first and the second data lines. The first and the second projections may be elongated in a direction where the first and the second data lines extend.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
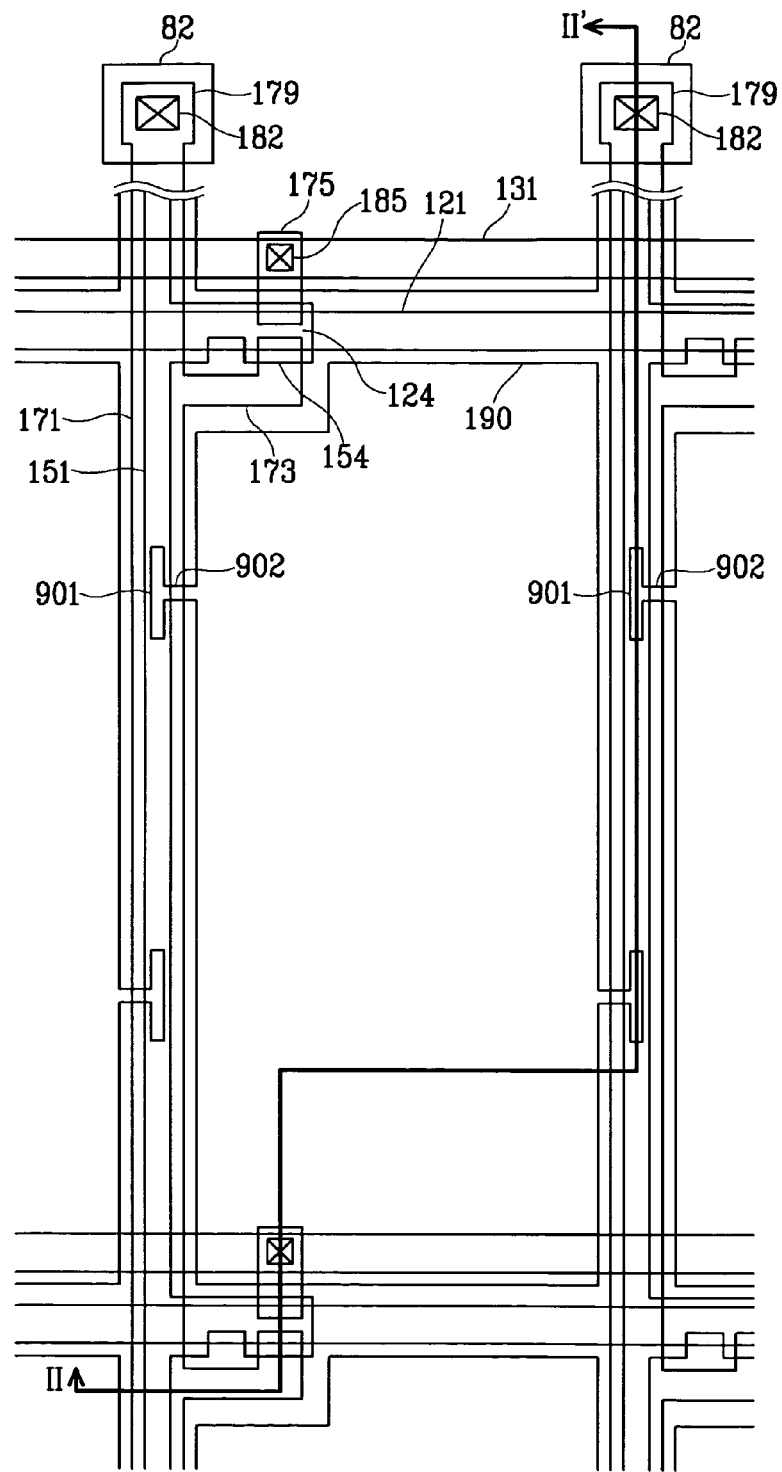
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1 and 2.

Figure 2:
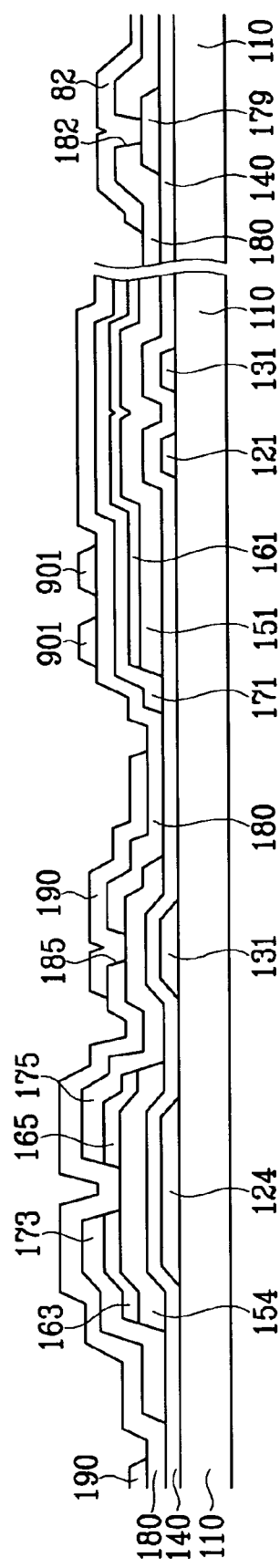
FIG. 2 is a sectional view of the TFT array panel shown in FIG. 1 taken along the line II-II'.

FIG. 1 is an exemplary layout view of a TFT array panel according to an embodiment of the present invention, and FIG. 2 is a sectional view of the TFT array panel shown in FIG. 1 taken along the line II-II'.

A plurality of gate lines 121 and a plurality of storage electrode lines 131, which are separated from each other, are formed on an insulating substrate 110.

Each gate line 121 for transmitting gate signals extends substantially in a transverse direction and a plurality of portions of each gate line 121 form a plurality of gate electrodes 124. Each gate line 121 may include an expanded end portion (not shown) having a large area for contact with another layer or an external device.

The storage electrode lines 131 extend substantially in the transverse direction and may have expansions. Each storage electrode line 131 is disposed between adjacent two gate lines 121 and it is disposed close to one of the two gate lines 121 for increasing aperture ratio. The storage electrode lines 131 are supplied with a predetermined voltage such as a common voltage that is applied to a common electrode (not shown) of another panel of the LCD.

The gate lines 121 and the storage electrode lines 131 are preferably made of Al containing metal such as Al and Al alloy, Ag containing metal such as Ag and Ag alloy, Cu containing metal such as Cu and Cu alloy, Cr, Mo, Mo alloy, Ta, or Ti. They may have a multi-layered structure including two films having different physical characteristics. One of the two films is preferably made of low resistivity metal including Al containing metal for reducing signal delay or voltage drop in the gate lines 121 and the storage electrode lines 131. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film. The gate lines 121 and the storage electrode lines 131 may have a triple-layered structure including a lower Mo film, an intermediate Al film, and an upper Mo film.

In addition, the lateral sides of the gate lines 121 and the storage electrode lines 131 are inclined relative to a surface of the substrate 110, and the inclination angle thereof ranges about 30-80 degrees.

A gate insulating layer 140 preferably made of silicon nitride (SiNx) or silicon oxide is formed on the gate lines 121 and the storage electrode lines 131.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. The width of each semiconductor stripe 151 may become large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range between about 30-80 degrees.

A plurality of data lines 171 and a plurality of drain electrodes 175 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of refractory metal such as Cr, Mo, Mo alloy, Ta and Ti. They may also include a lower film (not shown) preferably made of Mo, Mo alloy or Cr and an upper film (not shown) located thereon and preferably made of Al containing metal. Alternatively, the data lines 171, etc., include triple layers interposing a middle layer of Al or Al alloy.

Like the gate lines 121, the data lines 171 and the drain electrodes 175 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain-electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, and exposed portions of the semiconductor stripes 151, which are not covered with the data lines 171 and the drain electrodes 175. The passivation layer 180 is preferably made of inorganic material such as silicon nitride and silicon oxide. However, the passivation layer 180 may be made of photosensitive organic material having a good flatness characteristic, and low dielectric insulating material such as a-Si:C:O and a-Si:O:F formed by plasma enhanced chemical vapor deposition (PECVD). The passivation layer 180 may have a double-layered structure including a lower inorganic film and an upper organic film.

The passivation layer 180 has a plurality of contact holes 182 and 185 exposing the end portions 179 of the data lines 171 and the drain electrodes 175, respectively. It is preferable that the contact holes 182 and 185 do not expose Al containing metal, and if they expose Al containing metal, the Al containing metal is preferably removed by blanket etch.

A plurality of pixel electrodes 190 and a plurality of contact assistants 82, which are preferably made of ITO or IZO, are formed on the passivation layer 180.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with the common electrode, which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrode lines 131. The capacitances of the storage capacitors, i.e., the storage capacitances can be increased by providing expansions (not shown) at the storage electrode lines 131 and the drain electrodes 175 connected to the pixel electrodes 190 for increasing the overlapping areas.

The pixel electrodes 190 are spaced apart from the gate lines 121 and the data lines 171 to reduce the parasitic capacitance therebetween. However, each pixel electrode 190 includes a pair of projections 901 fully overlapping two data lines 171 adjacent thereto and each of the projections 901 includes a connection 902 connected to the pixel electrodes 190. The projections 901 extend in the longitudinal direction and have a width smaller than that of the data lines 171. The width of the projections 901 may be determined in consideration of the alignment margin between the projections 901 and the data lines 171. Preferably, all the projections 901 have substantially the same size.

The contact assistants 82 are connected to the exposed expansions 179 of the data lines 171 through the contact holes 182, respectively. The contact assistants 82 protect the exposed portions 179 and complement the adhesion between the exposed portions 179 and external devices.

The pixel electrodes 190 may be made of transparent conductive polymer. For a reflective LCD, the pixel electrodes 190 are made of opaque reflective metal. In these cases, the contact assistants 82 may be made of material such as ITO or IZO different from the pixel electrodes 190.

The TFT array panel may also include a gate driving circuits for generating gate signals to be applied to the gate lines 121.

The above-described projections 901 of the pixel electrodes 190 make the parasitic capacitance between the pixel electrodes 190 and the data lines 171, which will be described with reference to FIG. 3.

Figure 3:
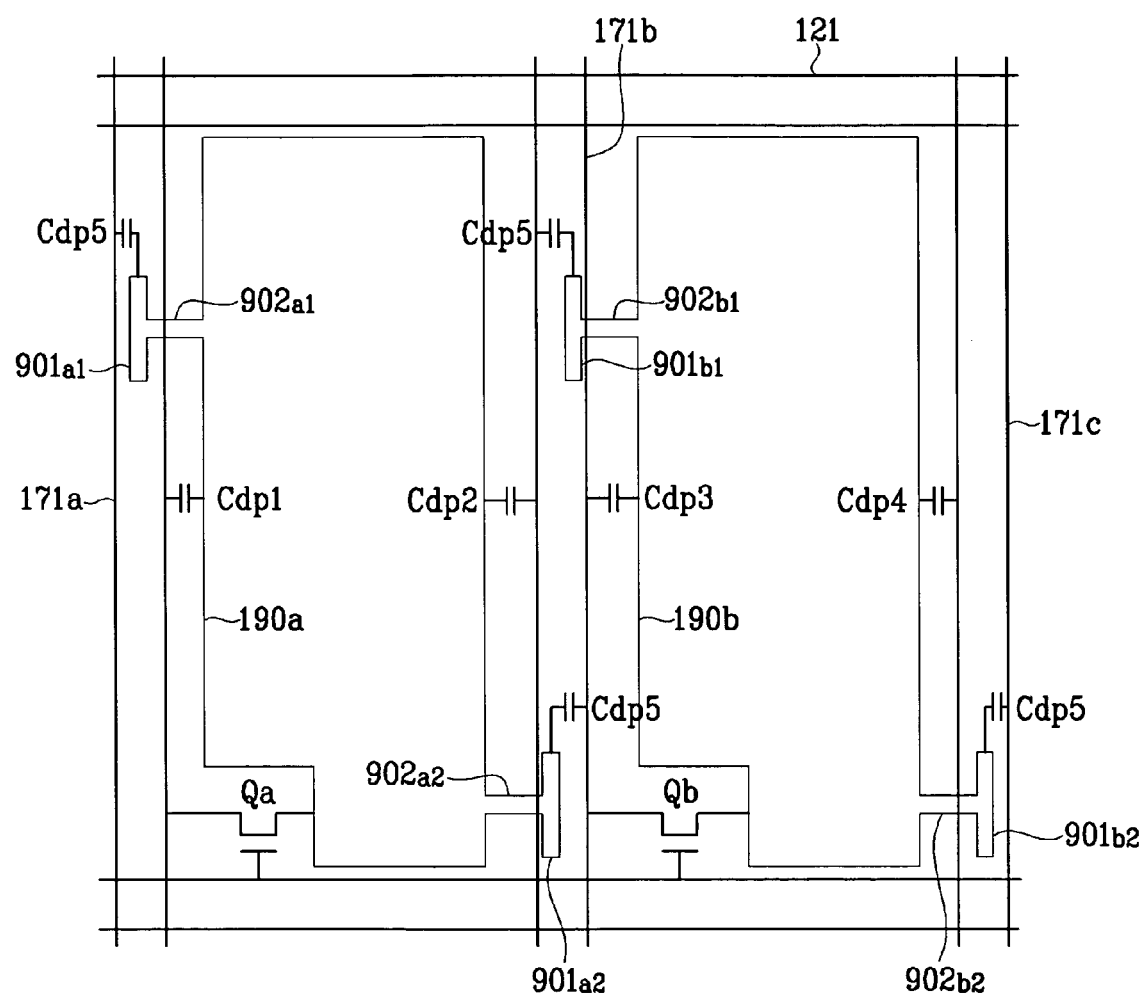
FIG. 3 is a schematic equivalent circuit diagram of the TFT array panel shown in FIGS. 1 and 2.

FIG. 3 is a schematic equivalent circuit diagram of the TFT array panel shown in FIGS. 1 and 2.

FIG. 3 shows two pixel electrodes 190a and 190b adjacent to each other and three data lines 171a, 171b and 171c disposed near the two pixel electrodes 190a and 190b. The pixel electrode 190a includes a pair of projections 901a1 and 901a2 overlapping the data lines 171a and 171b, respectively, and connected to the pixel electrode 190a by connections 902a1 and 902a2, respectively, and the pixel electrode 190b includes a pair of projections 901b1 and 901b2 overlapping the data lines 171b and 171c, respectively, and connected to the pixel electrode 190b by connections 902b1 and 902b2, respectively. The pixel electrode 190a is coupled to a TFT Qa connected to a gate line 121 and the data line 171a, while the pixel electrode 190b is coupled to a TFT Qb connected to the gate line 121 and the data line 171b. FIG. 3 further shows that the pixel electrode 190a is closer to the left data line 171a, while the pixel electrode 190b is closer to the right data line 171c.

The parasitic capacitances Cdp1, Cdp2, Cdp3 and Cdp4 are generated between the pixel electrode 190a and the data line 171a, between the pixel electrode 190a and the data line 171b, between the pixel electrode 190b and the data line 171b, and between the pixel electrode 190b and the data line 171c, respectively. The parasitic capacitances Cdp1-Cdp4 may be different from each other due to alignment margin between the pixel electrodes 190a and 190b and the data lines 171a-171c.

In the meantime, the data lines 171a-171c and the projections 901a1, 901a2, 901b1 and 901b2, which have substantially the same size and fully overlap the data lines 171a-171c, also make parasitic capacitors but having substantially equal capacitance Cdp5. In addition, the connections 902a1, 902a2, 902b1 and 902b2 also form parasitic capacitors with the data lines 171a-171c.

Since the parasitic capacitances Cdp1-Cdp4 are much smaller than the parasitic capacitance Cdp5, the parasitic capacitances Cdp1-Cdp4 can be ignored. In addition, the sum of the parasitic capacitances between the connection 901a1 and the data line 171a and between the connection 901a2 and the data line 171b is substantially equal to the sum of the parasitic capacitances between the connection 901b1 and the data line 171b and between the connection 901b2 and the data line 171c since the connections 902a1 and 902a2 and 902b1 and 902b2 are symmetrically arranged and the total overlapping areas between the connections 902a1 and 902a2 and the data lines 171a and 171b are substantially equal to the total overlapping areas between the connections 902b1 and 902b2 and the data lines 171b and 171c regardless of the alignment.

Accordingly, the total parasitic capacitances between the pixel electrode 190a and the data lines 171a and 171b are substantially equal to the total parasitic capacitances between the pixel electrode 190b and the data lines 171b and 171c. The parasitic capacitance Cdp5 is adjusted by varying the area of the projections 901a and 901b.

The signal delay and distortion caused by the increase of the total parasitic capacitance due to the addition of the parasitic capacitance Cdp5 can be compensated by reducing the resistance of the data lines, for example, by employing low resistivity metal or by increasing the width of the data lines 171.

A TFT array panel for an LCD according to another embodiment of the present invention will be described in detail with reference to FIGS. 4 and 5.

Figure 4:
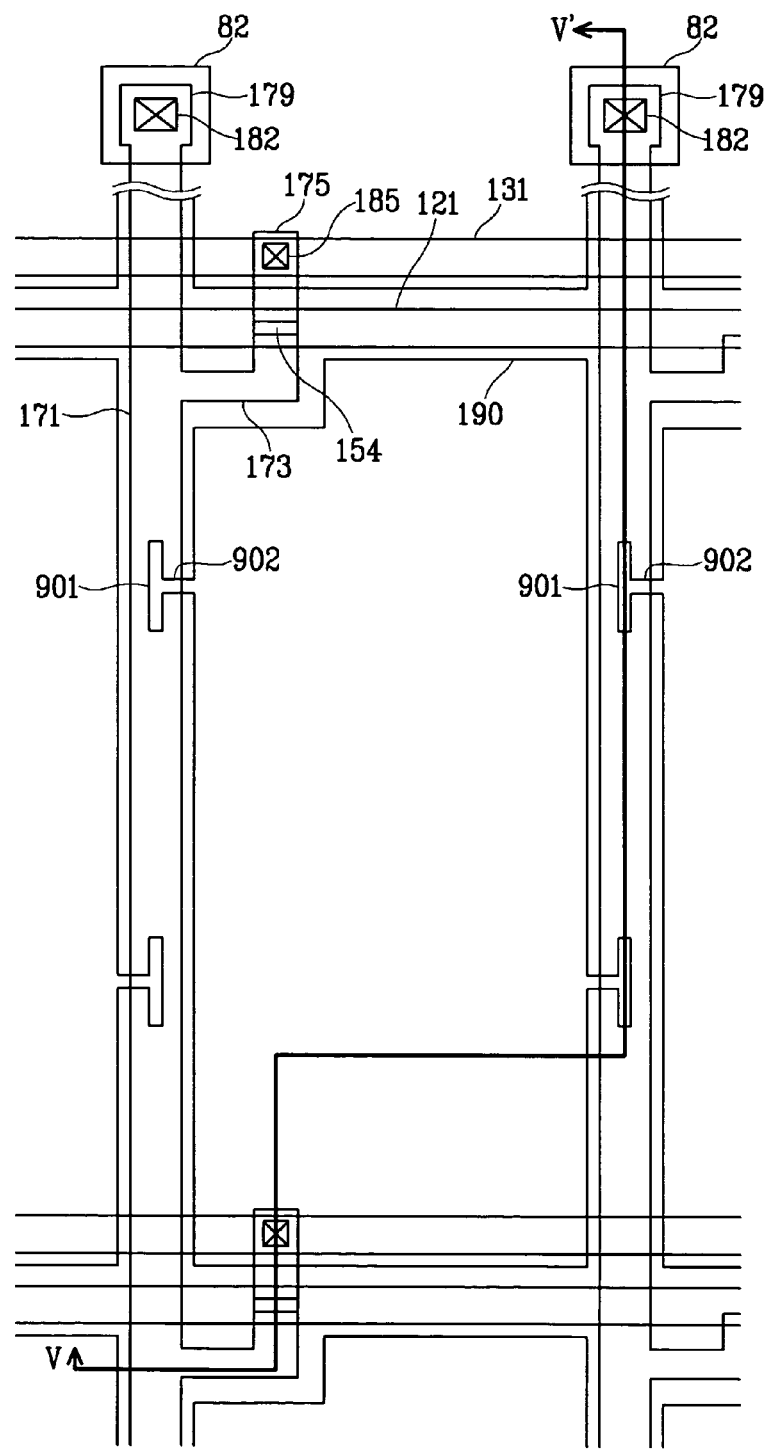
FIG. 4 is a layout view of a TFT array panel for an LCD according to another embodiment of the present invention.
Figure 5:
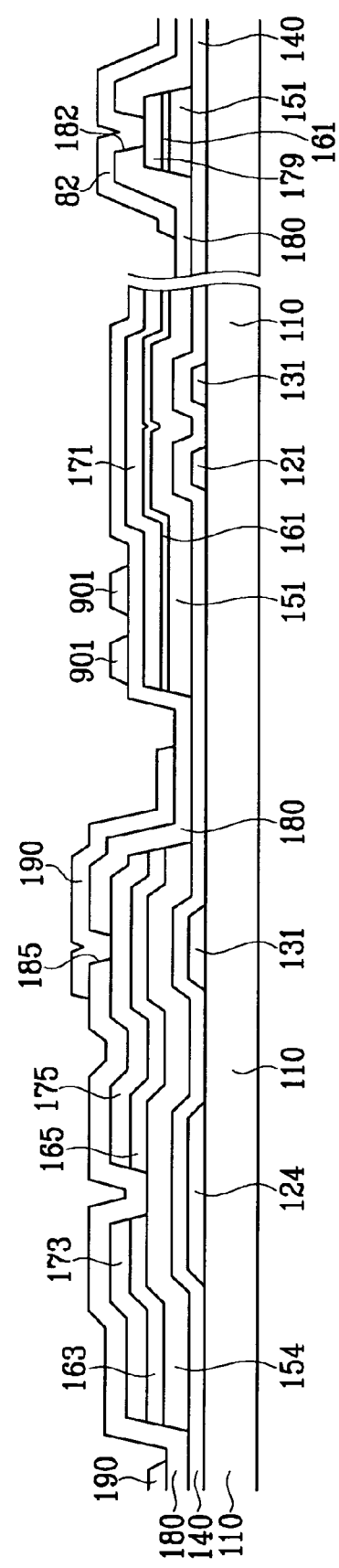
FIG. 5 is a sectional view of the TFT array panel shown in FIG. 4 taken along the line V-V'.

FIG. 4 is a layout view of a TFT array panel for an LCD according to another embodiment of the present invention, and FIG. 5 is a sectional view of the TFT array panel shown in FIG. 4 taken along the line V-V'.

Referring to FIGS. 4 and 5, a layered structure of the TFT array panel according to this embodiment is almost the same as those shown in FIGS. 1 and 2.

That is, a plurality of gate lines 121 including a plurality of gate electrodes 124 and a plurality of storage electrode lines 131 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 are formed thereon. A plurality of contact holes 182 and 185 are provided at the passivation layer 180 and the gate insulating layer 140, and a plurality of pixel electrodes 190 and a plurality of contact assistants 82 are formed on the passivation layer 180. In addition, the pixel electrodes 190 include a plurality of projections 901 connected through connections 902 for equalizing the parasitic capacitances.

Different from the TFT array panel shown in FIGS. 1 and 2, the semiconductor stripes 151 of the TFT array panel according to this embodiment have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
    a gate line;
    first and second data lines insulated from the gate line;
    a thin film transistor connected to the gate line and the first data line;
    a pixel electrode disposed between the first data line and the second data line, spaced apart from the first and the second data lines, and coupled to the thin film transistor; and
    first and second projections connected to the pixel electrode and overlapping the first and the second data lines, respectively.

2. The thin film transistor array panel of claim 1, further comprising an insulating layer disposed between the first and the second data lines; and the pixel electrodes and the first and the second projections.

3. The thin film transistor array panel of claim 2, wherein the insulating layer comprises inorganic material.

4. The thin film transistor array panel of claim 1, wherein the first and the second projections fully overlap the first and the data lines.

5. The thin film transistor array panel of claim 1, wherein the first and the second projections have a width smaller than width of the first and the second data lines.

6. The thin film transistor array panel of claim 5, wherein the first and the second projections are elongated in a direction where the first and the second data lines extend.

7. The thin film transistor array panel of claim 1, further comprising first and second connections connecting the first and the second projections to the pixel electrode, respectively.

8. The thin film transistor array panel of claim 1, further comprising:
    a first contact assistant coupled to the first data line through a first contact hole; and
    a second contact assistant coupled to the second data line through a second contact hole.

9. The thin film transistor array panel of claim 1, wherein the pixel electrode has first and second edges adjacent to the first data line and the second data line respectively, the first projection is projected from the first edge, the second projection is projected from the second edge, and the first and second projections have the widths smaller than the length of the first and the second edges, respectively.

10. A thin film transistor array panel comprising:
    a substrate;
    a gate line disposed on the substrate;
    a gate insulating layer disposed on the gate line;
    a semiconductor layer disposed on the gate insulating layer;
    an ohmic contact layer disposed on the semiconductor layer;
    first and second data lines disposed at least on the ohmic contact layer;
    a passivation layer disposed on the first and the second data lines; and
    a pixel electrode that is disposed on the passivation layer and includes first and second projections overlapping the first and the second data lines, respectively.

11. The thin film transistor array panel of claim 10, wherein the pixel electrode is located between the first data line and the second data line and spaced apart from the first and the second data lines.

12. The thin film transistor array panel of claim 11, wherein the passivation layer comprises inorganic material.

13. The thin film transistor array panel of claim 10, wherein the first and the second projections fully overlap the first and the data lines, respectively.

14. The thin film transistor array panel of claim 13, wherein the first and the second projections have a width smaller than width of the first and the second data lines.

15. The thin film transistor array panel of claim 14, wherein the first and the second projections are elongated in a direction where the first and the second data lines extend.

16. The thin film transistor array panel of claim 10, further comprising:
    a first contact assistant coupled to the first data line through a first contact hole; and
    a second contact assistant coupled to the second data line through a second contact hole.

17. The thin film transistor array panel of claim 10, wherein the pixel electrode has first and second edges adjacent to the first data line and the second data line respectively, the first projection is projected from the first edge, the second projection is projected from the second edge, and the first and second projections have the widths smaller than the length of the first and the second edges, respectively.

* * * * *